United States Patent
Watanabe et al.

(10) Patent No.: US 10,068,777 B2
(45) Date of Patent: *Sep. 4, 2018

(54) PLASMA ETCHING METHOD FOR SELECTIVELY ETCHING SILICON OXIDE WITH RESPECT TO SILICON NITRIDE

(71) Applicant: TOKYO ELECTRON LIMITED, Tokyo (JP)

(72) Inventors: Hikaru Watanabe, Miyagi (JP); Akihiro Tsuji, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/995,552

(22) Filed: Jan. 14, 2016

(65) Prior Publication Data
US 2016/0211150 A1     Jul. 21, 2016

(30) Foreign Application Priority Data
Jan. 16, 2015 (JP) .................................. 2015-006771

(51) Int. Cl.
*H01L 21/311* (2006.01)
*H01L 21/768* (2006.01)

(52) U.S. Cl.
CPC .. *H01L 21/31116* (2013.01); *H01L 21/31144* (2013.01); *H01L 21/76808* (2013.01); *H01L 21/76813* (2013.01)

(58) Field of Classification Search
CPC ........... H01L 21/31116; H01L 21/3144; H01L 21/76808; H01L 21/76813

USPC ........................................................ 438/712
See application file for complete search history.

(56) References Cited

U.S. PATENT DOCUMENTS

| 6,074,959 | A | * | 6/2000 | Wang | H01L 21/31116 216/68 |
| 6,183,655 | B1 | * | 2/2001 | Wang | H01L 21/31116 216/68 |
| 6,602,434 | B1 | * | 8/2003 | Hung | H01L 21/31116 216/39 |

(Continued)

FOREIGN PATENT DOCUMENTS

JP      2000-307001 A      11/2000

*Primary Examiner* — Yu Chen
*Assistant Examiner* — Scott Bauman
(74) *Attorney, Agent, or Firm* — Rothwell, Figg, Ernst & Manbeck, P.C.

(57) ABSTRACT

An etching method is provided for selectively etching a first region of silicon oxide with respect to a second region of silicon nitride by performing plasma processing on a target object including the first region and the second region. In the etch method, first, a plasma of a processing gas including a fluorocarbon gas is generated in a processing chamber where the target object is accommodated. Next, the plasma of the processing gas including the fluorocarbon gas is further generated in the processing chamber where the target object is accommodated. Next, the first region is etched by radicals of fluorocarbon contained in a deposit which is formed on the target object by the generation and the further generation of the plasma of the processing gas containing the fluorocarbon gas. A high frequency powers used for the plasma generation is smaller than a high frequency power used for plasma further generation.

14 Claims, 17 Drawing Sheets

(56) References Cited

U.S. PATENT DOCUMENTS

| | | | | |
|---|---|---|---|---|
| 6,803,318 B1 * | 10/2004 | Qiao | ................ | H01L 21/31116 |
| | | | | 257/E21.252 |
| 7,056,830 B2 * | 6/2006 | Merry | ................ | H01L 21/0332 |
| | | | | 257/E21.035 |
| 7,708,859 B2 | 5/2010 | Huang et al. | | |
| 9,837,285 B2 * | 12/2017 | Tomura | ............ | H01L 21/31144 |
| 2015/0235860 A1 * | 8/2015 | Tomura | ................ | H01L 21/311 |
| | | | | 438/694 |

* cited by examiner

PLASMA ETCHING METHOD FOR SELECTIVELY ETCHING SILICON OXIDE WITH RESPECT TO SILICON NITRIDE

CROSS-REFERENCE TO RELATED APPLICATIONS

This application claims priority to Japanese Patent Application No. 2015-006771 filed on Jan. 16, 2015, the entire contents of which are incorporated herein by reference.

FIELD OF THE INVENTION

The disclosure relates to an etching method, and more particularly, to a method for selectively etching a first region of silicon oxide with respect to a second region of silicon nitride by performing plasma processing on a target object.

BACKGROUND OF THE INVENTION

In manufacturing electronic devices, there is performed a process of forming an opening such as a hole or a trench at a region of silicon oxide ($SiO_2$). In such a process, a target object is exposed to a plasma of a fluorocarbon gas and then, the region of silicon oxide is etched, as disclosed in U.S. Pat. No. 7,708,859.

There is known a technique for selectively etching a first region of silicon oxide with respect to a second region of silicon nitride. A SAC (Self-Aligned Contact) technique disclosed in Japanese Patent Application Publication No. 2000-307001 is known as an example of such a technique.

The target object to be processed by the SAC technique includes a first region of silicon oxide, a second region of silicon nitride, and a mask. The second region is formed to have a recess. The first region is formed to fill the recess and cover the second region. The mask is provided on the first region and has an opening provided over the recess. As disclosed in Japanese Patent Application Publication No. 2000-307001, in the conventional SAC technique, a plasma of a processing gas including a fluorocarbon gas, an oxygen gas and a rare gas is used to etch the first region. By exposing the target object to the plasma of the processing gas, a portion of the first region which is exposed through the opening of the mask is etched. As a consequence, an upper opening is formed. Further, by exposing the target object to the plasma of the processing gas, a portion surrounded by the second region, i.e., the first region in the recess, is etched in a self-aligned manner. Accordingly, a lower opening continuous to the upper opening is formed in a self-aligned manner.

In the above-described conventional technique, at a time when the second region is exposed in the course of etching the first region, there occurs a state where a film for protecting the second region is not formed on a surface of the second region. Thus, if the etching of the first region is further performed in this state, a portion of the second region is also etched.

SUMMARY OF THE INVENTION

In view of the above, the disclosure provides an etching method for etching the first region of silicon oxide while suppressing etching of the second region of silicon nitride.

In accordance with an aspect of the disclosure, there is provided an etching method for selectively etching a first region of silicon oxide with respect to a second region of silicon nitride by performing plasma processing on a target object including the first region and the second region. In the etch method, first, a plasma of a processing gas including a fluorocarbon gas is generated in a processing chamber where the target object is accommodated. Next, the plasma of the processing gas including the fluorocarbon gas is further generated in the processing chamber where the target object is accommodated. Next, the first region is etched by radicals of fluorocarbon contained in a deposit which is formed on the target object by the generation and the further generation of the plasma of the processing gas including the fluorocarbon gas. A high frequency powers used for the plasma generation is smaller than a high frequency power used for plasma further generation.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
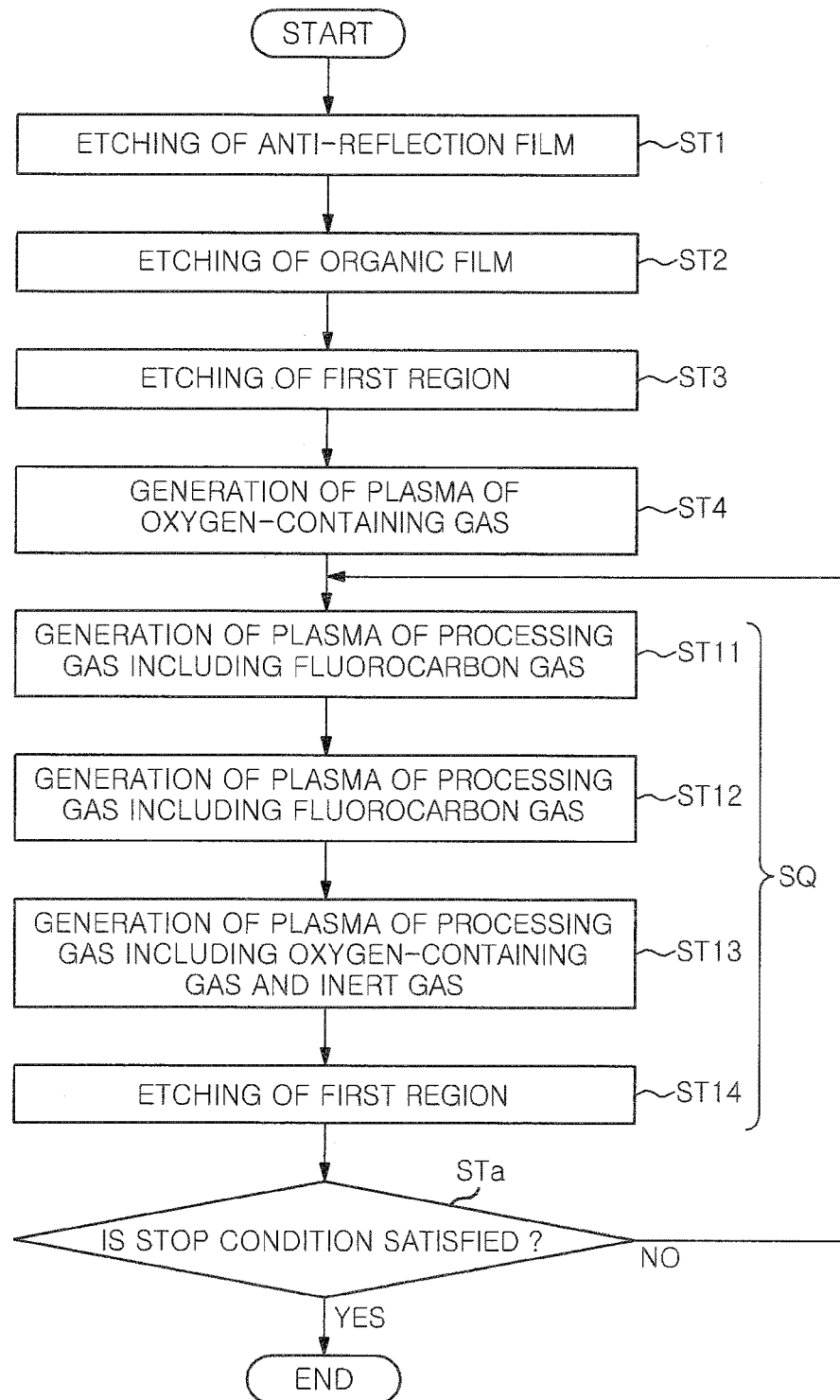
FIG. 1 is a flowchart of an etching method according to an embodiment.

Hereinafter, embodiments will be described with reference to the accompanying drawings. Like reference numerals will be used for like parts throughout the drawings.

FIG. 1 is a flowchart of an etching method according to an embodiment. A method MT shown in FIG. 1 is an etching method for selectively etching a first region of silicon oxide with respect to a second region of silicon nitride by performing plasma processing on a target object.

Figure 2:
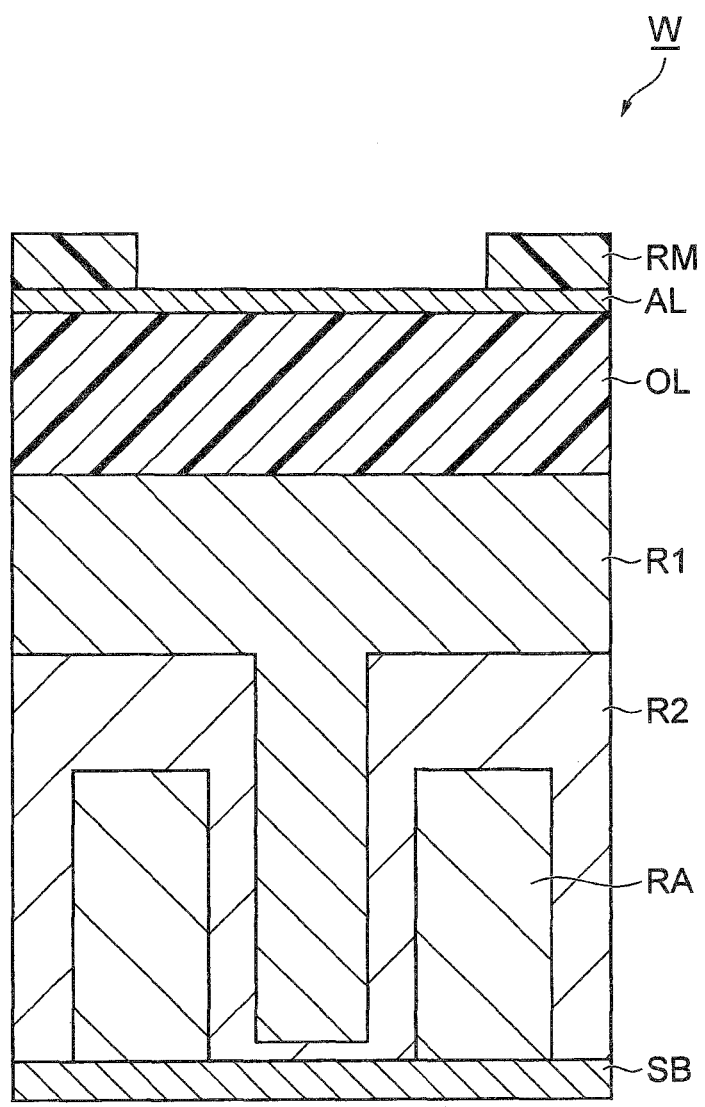
FIG. 2 is a cross sectional view showing an example of a target object to which the etching method according to the embodiment is applied.

FIG. 2 is a cross sectional view showing an example of a target object to which the etching method according to the embodiment is applied. As shown in FIG. 2, the target object, i.e., a wafer W, includes a substrate SB, a first region R1, a second region R2, and an organic film OL that will becomes a mask later. For example, this wafer W is obtained during the manufacturing process of a fin-type field effect transistor and further includes a protruding region RA, a silicon-containing anti-reflection film AL, and a resist mask RM.

The protruding region RA protrudes from the substrate SB. The protruding region RA may serve as, e.g., a gate region. The second region R2 is made of silicon nitride ($Si_3N_4$) and formed on surfaces of the protruding region RA and the substrate SB. As shown in FIG. 2, the second region R2 extends to form a recess. For example, the recess has a depth of about 150 nm and a width of about 20 nm.

The first region R1 is made of silicon oxide ($SiO_2$) and formed on the second region R2. Specifically, the first region R1 fills the recess formed by the second region R2 and covers the second region R2.

The organic film OL is formed on the first region R1. The organic film OL may be made of an organic material, e.g., amorphous carbon. The anti-reflection film AL is formed on the organic film OL. The resist mask RM is formed on the anti-reflection film AL. The resist mask RM provides an opening having a width greater than that of the recess formed by the second region R2. The opening of the resist mask RM has a width of, e.g., about 60 nm. A pattern of the resist mask RM is formed by a photolithography technique.

Figure 3:
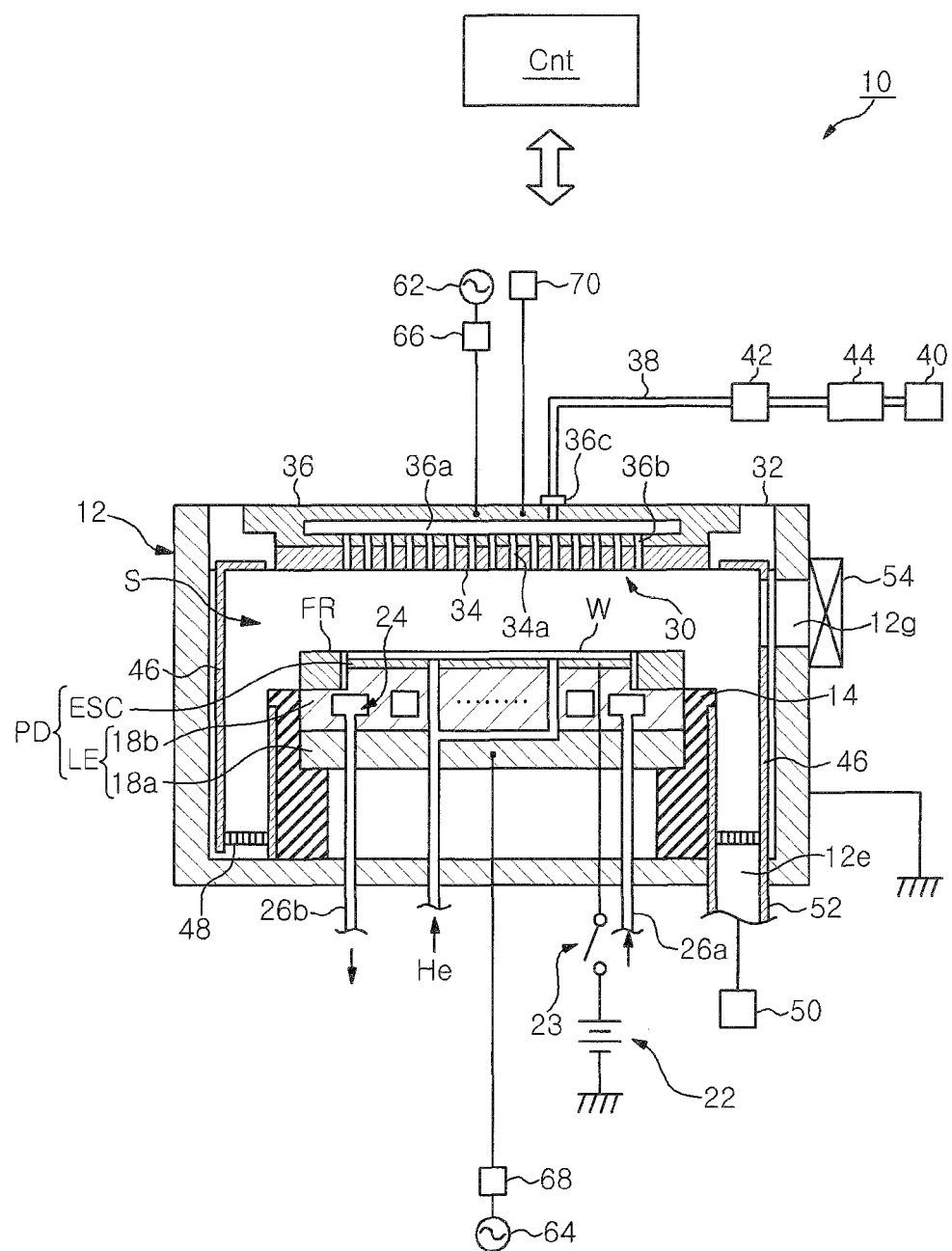
FIG. 3 schematically shows an example of a plasma processing apparatus capable of performing the method shown in FIG. 1.
Figure 4:
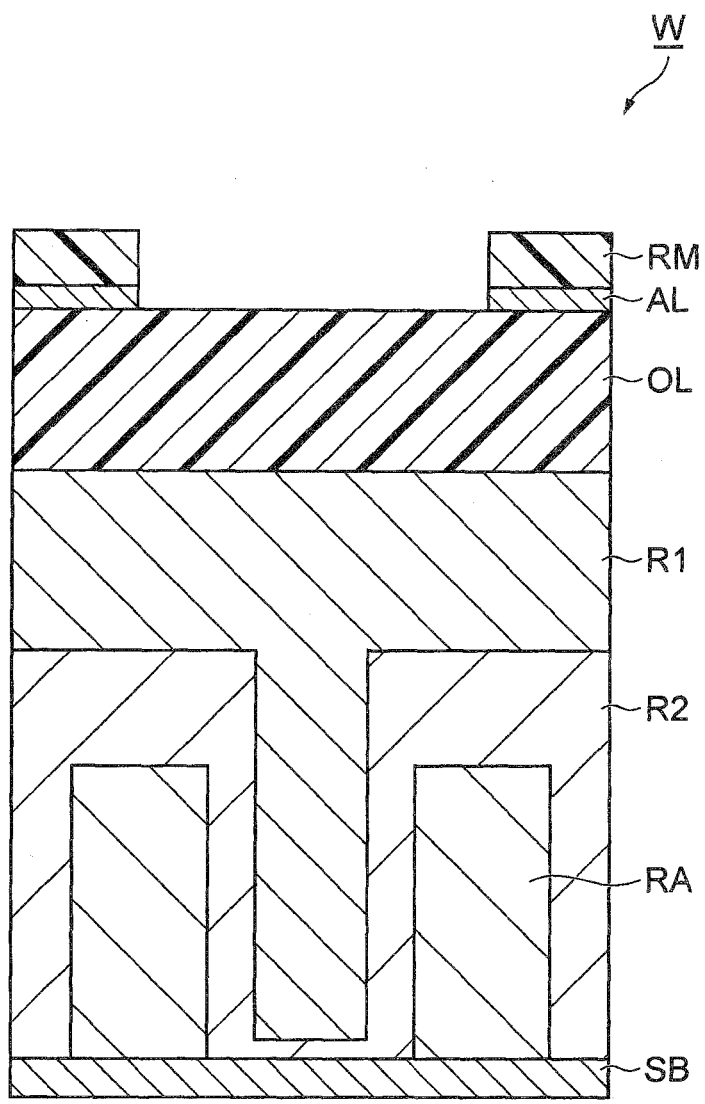
FIGS. 4 to 17 are cross sectional views showing the target object in respective steps of the etching method shown in FIG. 1.
Figure 5:
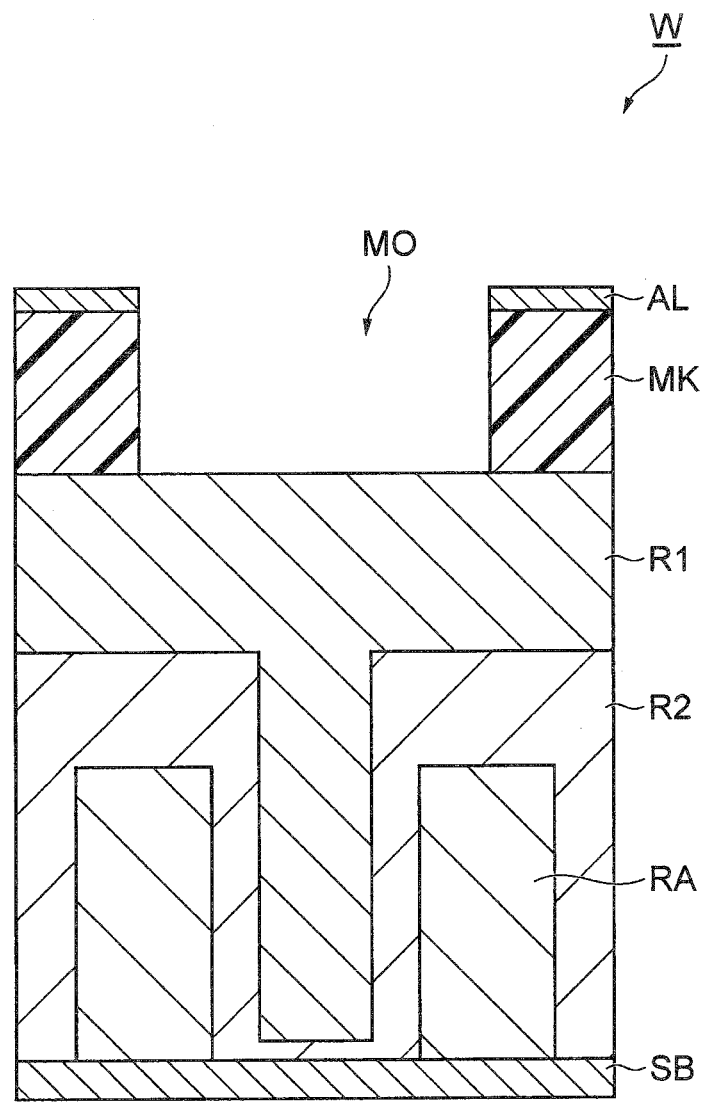
Figure 6:
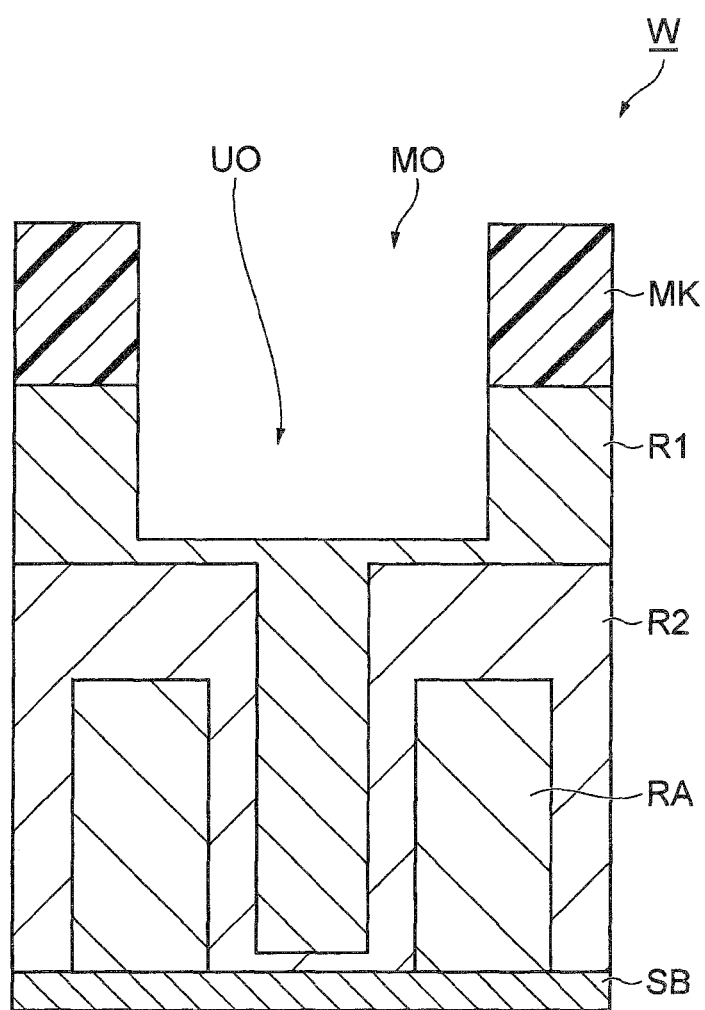
Figure 7:
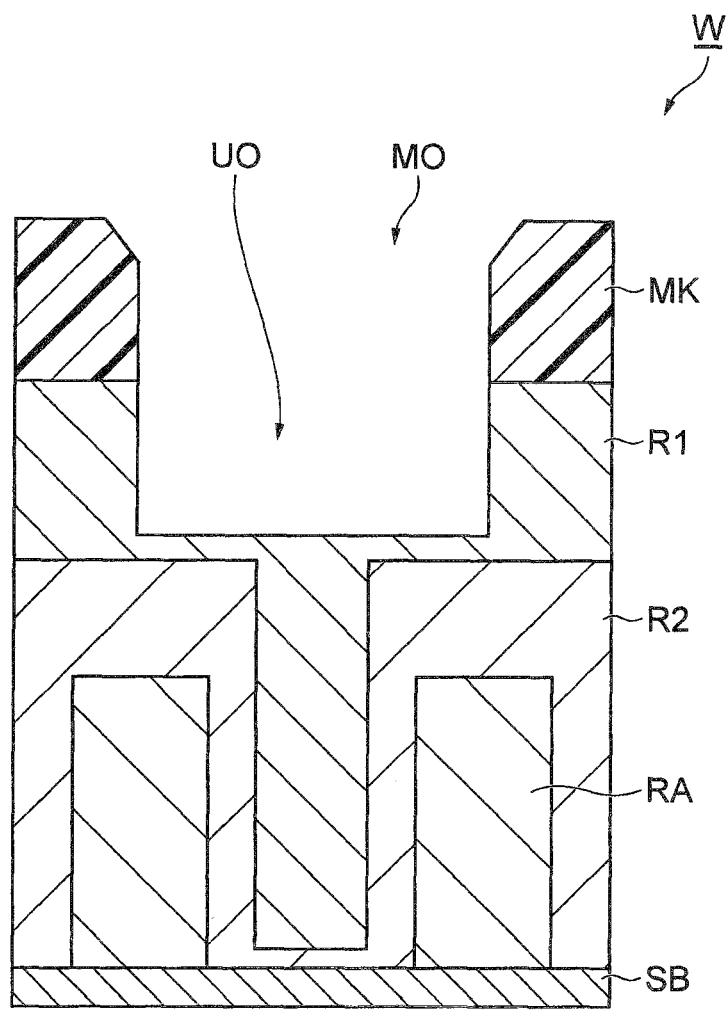

In the method MT, the target object such as the wafer W shown in FIG. 2 is processed in a plasma processing apparatus. FIG. 3 schematically shows an example of a plasma processing apparatus capable of performing the method shown in FIG. 1. A plasma processing apparatus 10 shown in FIG. 3 is configured as a capacitively coupled plasma etching apparatus and includes a substantially cylindrical processing chamber 12. An inner wall surface of the processing chamber 12 is made of, e.g., anodized aluminum. The processing chamber 12 is frame-grounded.

A substantially cylindrical supporting part 14 is provided at a bottom portion of the processing chamber 12. The supporting part 14 is made of, e.g., an insulating material. In the processing chamber 12, the supporting part extends vertically from the bottom portion of the processing chamber 12. Further, in the processing chamber 12, a mounting table PD is provided. The mounting table PD is supported by the supporting part 14.

The wafer W is held on a top surface of the mounting table PD. The mounting table PD includes a lower electrode LE and an electrostatic chuck ESC. The lower electrode LE has a first plate 18a and a second plate 18b. The first plate 18a and the second plate 18b are made of a metal, e.g., aluminum, and have a substantially disc shape. The second plate 18b is provided on the first plate 18a and electrically connected to the first plate 18a.

An electrostatic chuck ESC is provided on the second plate 18b. The electrostatic chuck ESC has a structure in which an electrode made of a conductive film is interposed between two insulating layers or two insulating sheets. A DC power supply 22 is electrically connected to the electrode of the electrostatic chuck ESC through a switch 23. The wafer W is attracted and held on the electrostatic chuck ESC by an electrostatic force such as a Coulomb force or the like generated by a DC voltage applied from the DC power supply 22.

A focus ring FR is provided on a peripheral portion of the second plate 18b to surround an edge of the wafer W and the electrostatic chuck ESC. The focus ring FR is provided to improve uniformity of etching. The focus ring FR is made of a material that is appropriately selected depending on a material of an etching target film. For example, the focus ring FR may be made of quartz.

A coolant path 24 is provided in the second plate 18b. The coolant path 24 constitutes a temperature control mechanism. A coolant is supplied to the coolant path 24 from an external chiller unit through a line 26a. The coolant flowing in the coolant path 24 returns to the chiller unit through a line 26b. The coolant circulates between the coolant path 24 and the chiller unit. A temperature of the wafer W held on the electrostatic chuck ESC is controlled by controlling a temperature of the coolant.

The plasma processing apparatus 10 further includes a gas supply line 28. A heat transfer gas supply unit (not shown) supplies a heat transfer gas, e.g., He gas to a gap between a top surface of the electrostatic chuck ESC and a backside of the wafer W through the gas supply line 28.

The plasma processing apparatus 10 further includes an upper electrode 30. The upper electrode 30 is provided above the mounting table PD to face the mounting table PD. The upper electrode 30 and the lower electrode LE are approximately parallel to each other. Between the upper electrode 30 and the lower electrode LE, a processing space S where plasma processing is performed on the wafer W is defined.

The upper electrode 30 is held at an upper portion of the processing chamber 12 through an insulating shield member 32. In the present embodiment, the upper electrode 30 may be configured such that a vertical distance from a top surface of the mounting table PD, i.e., a wafer mounting surface, to the upper electrode 30 is variable. The upper electrode 30 may include an electrode plate 34 and an electrode plate holder 36. The electrode plate 34 is in contact with the space S and has a plurality of gas injection openings 34a. In the present embodiment, the electrode plate 34 is made of silicon.

The electrode plate holder 36 detachably holds the electrode plate 34 and is made of a conductive material, e.g., aluminum. The electrode plate holder 36 may have a water cooling structure. A gas diffusion space 36a is provided in the electrode plate holder 36. A plurality of gas passage holes 36b communicating with the gas injection openings 34a extends downward from the gas diffusion space 36a. Further, the electrode plate holder 36 includes a gas inlet port 36c for guiding a processing gas into the gas diffusion space 36a. A gas supply line 38 is connected to the gas inlet port 36c.

The gas supply line 38 is connected to a gas source group 40 through a valve group 42 and a flow rate controller group 44. The gas source group 40 includes a plurality of gas sources. In this example, the gas source group 40 includes one or more fluorocarbon gas sources, a rare gas source, a nitrogen gas ($N_2$ gas) source, a hydrogen gas ($H_2$ gas) source, and an oxygen-containing gas source. One or more fluorocarbon gas sources may include a $C_4F_8$ gas source, a $CF_4$ gas source, and a $C_4F_8$ gas source. The rare gas source may be a source of any rare gas such as He gas, Ne gas, Ar gas, Kr gas, Xe gas or the like. In this example, the rare gas source may be an Ar gas source. In this example, the oxygen-containing gas source may be an oxygen gas ($O_2$ gas) source. The oxygen-containing gas may also be any gas containing oxygen, e.g., a carbon oxide gas such as CO gas or $CO_2$ gas.

The valve group 42 includes a plurality of valves. The flow rate controller group 44 includes a plurality of flow rate controllers such as a mass flow rate controller and the like. The gas sources of the gas source group 40 are connected to the gas supply line 38 through corresponding valves of the valve group 42 and corresponding flow rate controllers of the flow rate controller group 44, respectively.

In the plasma processing apparatus 10, a deposition shield 46 is detachably provided along the inner wall of the processing chamber 12. The deposition shield 46 is also provided at an outer periphery of the supporting part 14. The deposition shield 46 prevents an etching by-product (deposit) from being adhered to the processing chamber 12. The deposition shield 46 may be made of aluminum coated with ceramic such as $Y_2O_3$ or the like.

A gas exhaust plate 48 is provided at a lower portion in the processing chamber 12 and between the supporting part 14 and the sidewall of the processing chamber 12. The gas exhaust plate 48 may be formed by coating aluminum with ceramic, e.g., $Y_2O_3$ or the like. In the processing chamber 12, a gas exhaust port 12e is provided below the gas exhaust plate 48. A gas exhaust unit 50 is connected to the gas exhaust port 12e through a gas exhaust line 52. The gas exhaust unit 50 has a vacuum pump such as a turbo molecular pump or the like, and can depressurize the space in the processing chamber 12 to a predetermined vacuum level. A loading/unloading port 12g for the wafer W is provided at the sidewall of the processing chamber 12. The loading/unloading port 12g can be opened and closed by a gate valve 54.

The plasma processing apparatus 10 further includes a first high frequency power supply 62 and a second high frequency power supply 64. The first high frequency power supply 62 generates a high frequency power for plasma generation, e.g., a high frequency power having a frequency in a range from 27 MHz to 100 MHz. The first high frequency power supply 62 is connected to the upper electrode 30 through a matching unit 66. The matching unit 66 is a circuit for matching an output impedance of the first high frequency power supply 62 with an input impedance of the load side (the upper electrode 30 side). The first high frequency power supply 62 may be connected to the lower electrode LE through the matching unit 66.

The second high frequency power supply 64 generates a high frequency bias power for ion attraction to the wafer W, e.g., a high frequency bias power having a frequency in a range from 400 kHz to 13.56 MHz. The second high frequency power supply 64 is connected to the lower electrode LE through a matching unit 68. The matching unit 68 is a circuit for matching an output impedance of the second high frequency power supply 64 with an input impedance of the load side (the lower electrode LE side).

The plasma processing apparatus 10 further includes a power supply 70. The power supply 70 is connected to the upper electrode 30. The power supply 70 applies to the upper electrode 30 a voltage for attracting positive ions in the processing space S to the electrode plate 34. In this example, the power supply 70 is a DC power supply for generating a negative DC voltage. In another example, the power supply 70 may be an AC power supply for generating an AC voltage having a relatively low frequency. The voltage applied from the power supply 70 to the upper electrode 30 may be lower than or equal to −150V. In other words, the voltage applied from the power supply 70 to the upper electrode 30 may be a negative voltage having an absolute value of 150 or above. When such a voltage is applied from the power supply 70 to the upper electrode 30, the positive ions in the processing space S collide with the electrode plate 34. Accordingly, secondary electrons and/or silicon are emitted from the electrode plate 34. The emitted silicon is combined with active species of fluorine in the processing space S, so that the amount of active species of fluorine is decreased.

In the present embodiment, the plasma processing apparatus 10 may further include a control unit Cnt. The control unit Cnt is a computer including a processor, a storage unit, an input device, a display device and the like. The control unit Cnt controls the respective components of the plasma processing apparatus 10. The control unit Cnt can allow an operator to input commands to manage the plasma processing apparatus 10 by using the input device and display the operation state of the plasma processing apparatus 10 on the display device. The storage unit of the control unit Cnt stores therein a control program for controlling various processes performed in the plasma processing apparatus 10, and a program, i.e., a processing recipe, for performing processes of the respective components of the plasma processing apparatus 10 based on the processing conditions.

Referring back to FIG. 1, the method MT1 will be described in detail. FIGS. 2 and 4 to 17 will be appropriately referred to in the following description. FIGS. 4 to 17 are cross sectional views showing the target object in respective steps of the method MT. In the following description, there will be described an example in which the wafer W shown in FIG. 2 is processed by the plasma processing apparatus 10 shown in FIG. 3 according to the method MT.

In the method MT, first, the wafer W shown in FIG. 2 is loaded into the plasma processing apparatus 10 and then mounted and held on the mounting table PD.

Next, a step ST1 of the method MT1 is executed. In the step ST1, the anti-reflection film AL is etched. To do so, a processing gas is supplied into the processing chamber 12 from a gas source selected among the gas sources of the gas source group 40. This processing gas used in the step ST1 includes a fluorocarbon gas. The fluorocarbon gas may contain, e.g., at least one of $C_4F_8$ gas and $CF_4$ gas. The processing gas may further include a rare gas, e.g., Ar gas. In the step ST1, a pressure in the processing chamber 12 is set to a predetermined level by the operation of the gas exhaust unit 50. In the step ST1, the high frequency power from the first high frequency power supply 62 and the high frequency bias power from the second high frequency power supply 64 are supplied to the lower electrode LE.

The step ST1 is executed under the following condition.
Pressure in processing chamber: 10 mTorr (1.33 Pa) to 50 mTorr (6.65 Pa)
Processing gas
$C_4F_8$ gas: 10 sccm to 30 sccm
$CF_4$ gas: 150 sccm to 300 sccm
Ar gas: 200 sccm to 500 sccm
High frequency power for plasma generation: 300 W to 1000 W
High frequency bias power: 200 W to 500 W In the step ST1, the plasma of the processing gas is generated and a portion of the anti-reflection film AL which is exposed through the opening of the resist mask RM is etched by active species of fluorocarbon. As a result, the portion of the anti-reflection film AL which is exposed through the opening of the resist mask RM is removed as can be seen from FIG. 4. In other words, a pattern of the resist mask RM is transferred onto the anti-reflection film AL and the anti-reflection film AL is formed to have a pattern providing an opening. In the step ST1, the operation of each component of the plasma processing apparatus 10 can be controlled by the control unit Cnt.

Next, in a step ST2, the organic film OL is etched. To do so, a processing gas is supplied into the processing chamber 12 from a gas source selected among the gas sources of the gas source group 40. This processing gas used in the step ST2 may include hydrogen gas and nitrogen gas. Moreover, the processing gas used in the step ST2 may contain another gas, e.g., oxygen gas, as long as it can etch the organic film. In the step ST2, a pressure in the processing chamber 12 is set to a predetermined level by the operation of the gas exhaust unit 50. In the step ST2, the high frequency power from the first high frequency power supply 62 and the high frequency bias power from the second high frequency power supply 64 are supplied to the lower electrode LE.

The step ST2 is executed under the following condition.
Pressure in processing chamber: 50 mTorr (6.65 Pa) to 200 mTorr (26.6 Pa)
Processing gas
$N_2$ gas: 200 sccm to 400 sccm
$H_2$ gas: 200 sccm to 400 sccm
High frequency power for plasma generation: 500 W to 2000 W
High frequency bias power: 200 W to 500 W In the step ST2, the plasma of the processing gas is generated and a portion of the organic film OL which is exposed through the opening of the anti-reflection film AL is etched. The resist mask RM is also etched. As a result, the resist mask RM is removed and the portion of the organic film OL which is exposed through the opening of the anti-reflection film AL is removed, as can be seen from FIG. 5. In other words, the pattern of the anti-reflection film AL is transferred onto the organic film OL and the organic film OL is formed to have a pattern providing an opening MO, thereby serving as a mask MK. In the step ST2, the operation of each component of the plasma processing apparatus 10 can be controlled by the control unit Cnt.

In the present embodiment, a step ST3 is executed after the step ST2. In the step ST3, the first region R1 is etched. The etching of the first region R1 is stopped immediately before the second region R2 is exposed. In other words, the first region R1 is etched until the first region R1 remains a little on the second region R2. To do so, in the step ST3, a processing gas is supplied into the processing chamber 12 from a gas source selected among the gas sources of the gas source group 40. This processing gas used in the step ST3 includes a fluorocarbon gas. Moreover, the processing gas may further include a rare gas, e.g., Ar gas. Further, the processing gas may include oxygen gas. In the step ST3, a pressure in the processing chamber 12 is set to a predetermined level by the operation of the gas exhaust unit 50. In the step ST3, the high frequency power supply from the first high frequency power supply 62 and the high frequency bias power from the second high frequency power supply 64 are supplied to the lower electrode LE.

In the step ST3, the plasma of the processing gas is generated and a portion of the first region R1 which is exposed through the opening of the mask MK is etched by active species of fluorocarbon. The processing time of the step ST3 is set such that the etched first region R1 having a predetermined film thickness remains on the second region R2 after the execution of the step ST3. As a result of the execution of the step ST3, an upper opening UO is partially formed as can be seen from FIG. 6. The operation of each component of the plasma processing apparatus 10 in the step ST3 can be controlled by the control unit Cnt.

In a step ST11 and a step ST12 which will be described later, the condition that realizes a deposition mode, i.e., a mode in which deposition of deposit containing fluorocarbon on the surface of the wafer W including the first region R1 dominates over the etching of the first region R1, is selected. On the other hand, in the step ST3, the condition that realizes an etching mode, i.e., a mode in which the etching of the first region R1 dominates over the deposition of deposit, is selected. To do so, in this example, the fluorocarbon gas used in the step ST3 may include at least one of $C_4F_8$ gas and $CF_4$ gas. A ratio of fluorine atoms to carbon atoms (i.e., the number of fluorine atoms/the number of carbon atoms) in the fluorocarbon gas used in the step ST3 is higher than that in the fluorocarbon gas used in the step ST11 and the step ST12. In this example, in order to increase a degree of dissociation of the fluorocarbon gas, the high frequency power for plasma generation used in the step ST3 may be set to be greater than that used in the step ST11 and the step ST12. Accordingly, the etching mode can be realized. Moreover, in this example, the high frequency bias power used in the step ST3 may be set to be greater than the high frequency bias power used in the step ST11 and the step ST12. Accordingly, the energy of ions attracted to the wafer W can be increased, so that the first region R1 can be etched at a high speed.

The step ST3 is executed under the following condition.
Pressure in processing chamber: 10 mTorr (1.33 Pa) to 50 mTorr (6.65 Pa)
Processing gas
$C_4F_8$ gas: 10 sccm to 30 sccm
$CF_4$ gas: 50 sccm to 150 sccm
Ar gas: 500 sccm to 1000 sccm
$O_2$ gas: 10 sccm to 30 sccm
High frequency power for plasma generation: 500 W to 2000 W
High frequency bias power: 500 W to 2000 W Next, a step ST4 is executed. In the step ST4, a plasma of a processing gas containing an oxygen-containing gas is generated in the processing chamber 12. To do so the processing gas is supplied into the processing chamber 12 from a gas source selected among the gas sources of the gas source group 40. In this example, this processing gas used in the step ST4 may contain oxygen gas as an oxygen-containing gas. Moreover, the processing gas may further include a rare gas (e.g., Ar gas) or an inert gas such as nitrogen gas. In the step ST4, a pressure in the processing chamber 12 is set to a predetermined level by the operation of the gas exhaust unit 50. In the step ST4, the high frequency power from the first high frequency power supply 62 is supplied to the lower electrode LE. In the step ST4, the high frequency bias power from the second high frequency power supply 64 may not be supplied to the lower electrode LE.

In the step ST4, active species of oxygen are generated. A width of an upper end portion of the opening MO of the mask MK is increased by the active species of oxygen. Specifically, an upper shoulder portion of the mask MK which forms the upper end portion of the opening MO is etched in a tapered shape as can be seen from FIG. 7. Accordingly, even if a deposit generated in the following steps is adhered to a surface defining the opening MO of the mask MK, the decrease in the width of the opening MO can be reduced. The operation of each component of the plasma processing apparatus 10 in the step ST4 can be controlled by the control unit Cnt.

In a step ST13 to be described later, the step ST13 is carried out to decrease a very small amount of deposit generated in each sequence, and there is a need to suppress excessive decrease of the deposit. On the other hand, the step ST4 is executed to increase the width of the upper end portion of the opening MO of the mask MK and the processing time of the step ST4 needs to be short.

The step ST4 is executed under the following condition.
Pressure in processing chamber: 30 mTorr (3.99 Pa) to 200 mTorr (26.6 Pa)
Processing gas
$O_2$ gas: 50 sccm to 500 sccm
Ar gas: 200 sccm to 1500 sccm
High frequency power for plasma generation: 100 W to 500 W
High frequency bias power: 0 W to 200 W Next, in the method MT, a sequence SQ is performed to etch the first region R1. In the present embodiment, the sequence SQ is repeatedly performed. The sequence SQ includes a step ST11, a step ST12, and a step ST14 that are executed in that order. In the present embodiment, the sequence SQ further includes a step ST13 executed between the step ST12 and the step ST14.

Figure 8:
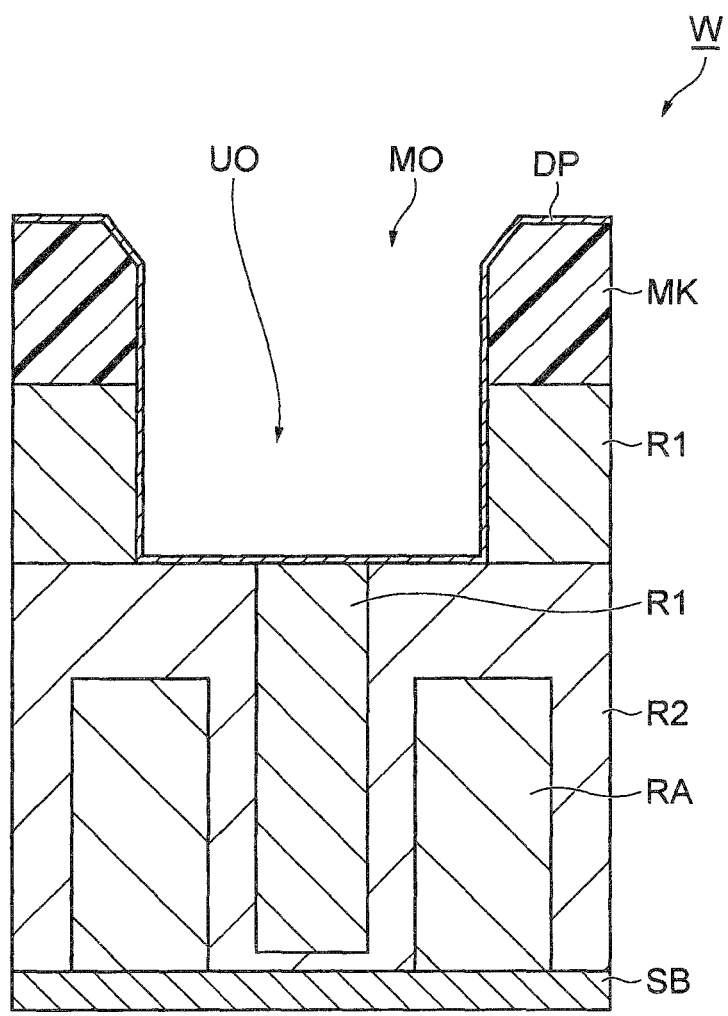

In the sequence SQ, the step ST11 is first executed. In the step ST11, a plasma of a processing gas is generated in the processing chamber 12 where the wafer W is accommodated. To do so, in the step ST11, the processing gas is supplied into the processing chamber 12 from a gas source selected among the gas sources of the gas source group 40. This processing gas used in the step ST11 includes a fluorocarbon gas. The processing gas may further include a rare gas, e.g., Ar gas. In the step ST11, a pressure in the processing chamber 12 is set to a predetermined level by the operation of the gas exhaust unit 50. In the step ST11, the high frequency power from the first high frequency power supply 62 is supplied to the lower electrode LE. Accordingly, the plasma of the processing gas including a fluorocarbon gas is generated and dissociated fluorocarbon is deposited on the surface of the wafer W. As a result, a deposit DP is formed as shown in FIG. 8. The operation of each component of the plasma processing apparatus 10 in the step ST11 can be controlled by the control unit Cnt.

Figure 9:
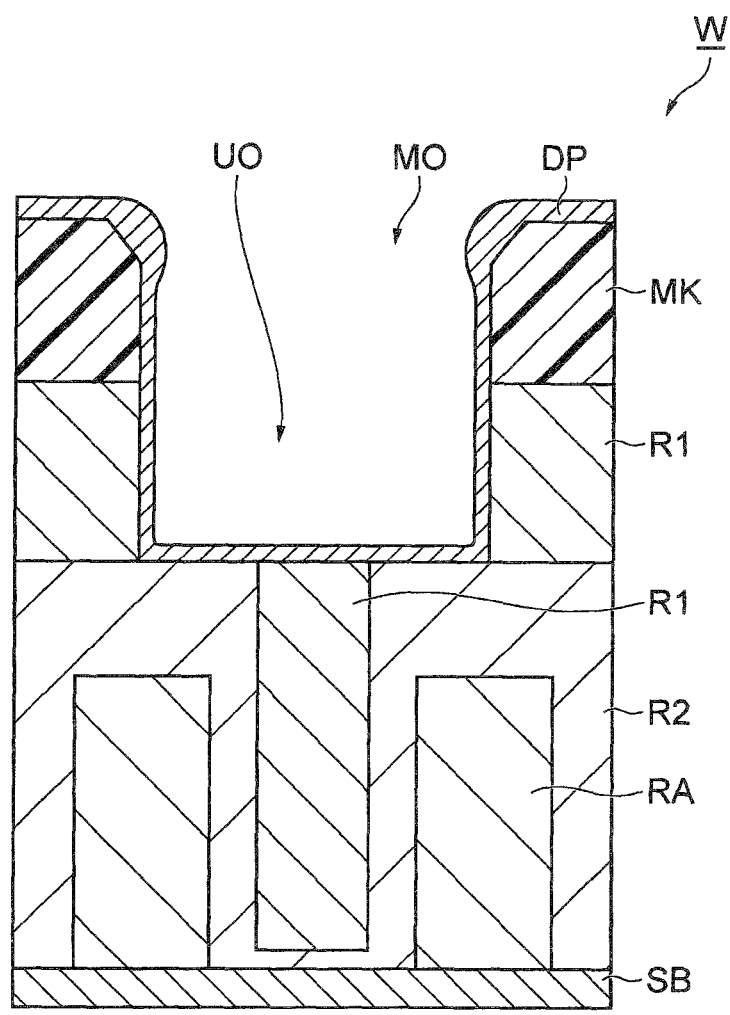

Next, in the step ST12, the plasma of the processing gas is further generated in the processing chamber 12 where the wafer W is accommodated. To do so, in the step ST12, the processing gas is supplied into the processing chamber 12 from a gas source selected among the gas sources of the gas source group 40. This processing gas used in the step ST12 includes a fluorocarbon gas. The processing gas may further include a rare gas, e.g., Ar gas. In the step ST12, a pressure in the processing chamber 12 is set to a predetermined level by the operation of the gas exhaust unit 50. In the step ST12, the high frequency power from the first high frequency power supply 62 is supplied to the lower electrode LE. Accordingly, the plasma of the processing gas including the fluorocarbon gas is generated and dissociated fluorocarbon is deposited on the surface of the wafer W. As a result, the amount of the deposit DP is increased as shown in FIG. 9. The operation of each component of the plasma processing apparatus 10 in the step ST12 can be controlled by the control unit Cnt.

As described above, in the step ST11 and the step ST12, the condition that realizes the deposition mode is selected. In this example, $C_4F_6$ gas is used as the fluorocarbon gas.

Moreover, the high frequency power for plasma generation used in the step ST11 is set to be smaller than that used in the step ST12. When the high frequency power used for generation of the plasma of the processing gas including the fluorocarbon gas is small, the dissociation degree of fluorocarbon is decreased and, thus, the amount of the deposit DP formed on the wafer W is also decreased. However, the etching amount of the wafer W is also decreased. On the other hand, when such a high frequency power is large, the dissociation degree of fluorocarbon is increased and, thus, the amount of the deposit DP formed on the wafer W is increased. However, the etching amount of the wafer W is also increased. In the method MT, the high frequency power used in the step ST11 is small as described above, so that the deposit DP can be thinly formed on the second region R2 while suppressing the etching amount of the wafer W, i.e., the etching amount of the second region R2. The amount of the deposit PD formed on the wafer W can be increased by using the high frequency power in the step ST12 while protecting the second region by the thin deposit PD formed in the step ST11. Therefore, the amount of the deposit DP formed on the second region R2 can be increased while suppressing the etching of the second region R2. Especially, the etching of the second region R2 can be suppressed by executing the steps ST11 and ST12 in a period including a time when the second region R2 is exposed.

The step ST11 is executed under the following condition.
Pressure in processing chamber: 10 mTorr (1.33 Pa) to 50 mTorr (6.65 Pa)
Processing gas
$C_4F_6$ gas: 2 sccm to 10 sccm
Ar gas: 500 sccm to 1500 sccm
High frequency power for plasma generation: 100 W to 300 W
High frequency bias power: 0 W The step ST12 is executed under the following condition.
Pressure in processing chamber: 10 mTorr (1.33 Pa) to 50 mTorr (6.65 Pa)
Processing gas
$O_4F_6$ gas: 2 sccm to 10 sccm
Ar gas: 500 sccm to 1500 sccm
High frequency power for plasma generation: 300 W to 1000 W
High frequency bias power: 0 W Next, the step ST13 is executed in the present embodiment. In the step ST13, a plasma of a processing gas including an oxygen-containing gas and an inert gas is generated in the processing chamber 12. To do so, in the step ST13, the processing gas is supplied into the processing chamber 12 from a gas source selected among the gas sources of the gas source group 40. In this example, this processing gas used in the step ST13 includes oxygen gas as the oxygen-containing gas. Further, in this example, the processing gas includes, as the inert gas, a rare gas such as Ar gas. The inert gas may be nitrogen gas. In the step ST13, a pressure in the processing chamber 12 is set to a predetermined level by the operation of the gas exhaust unit 50. In the step ST13, the high frequency power from the first high frequency power supply 62 is supplied to the lower electrode LE. In the step ST13, the high frequency bias power from the second high frequency power supply 64 may not be supplied to the lower electrode LE.

Figure 10:
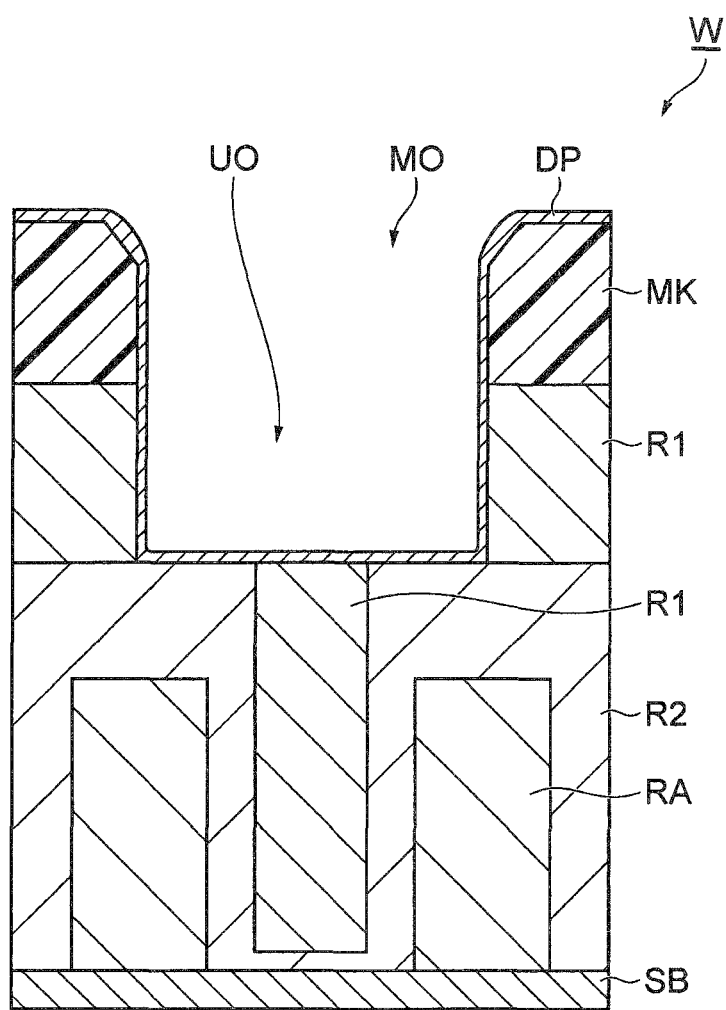
Figure 11:
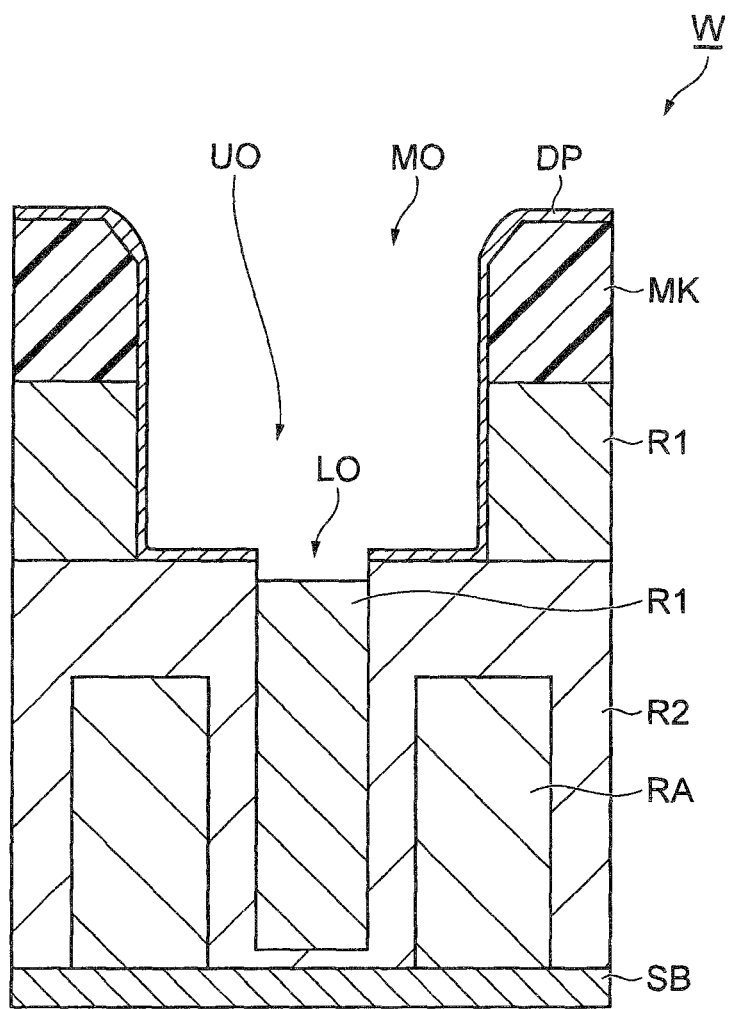
Figure 12:
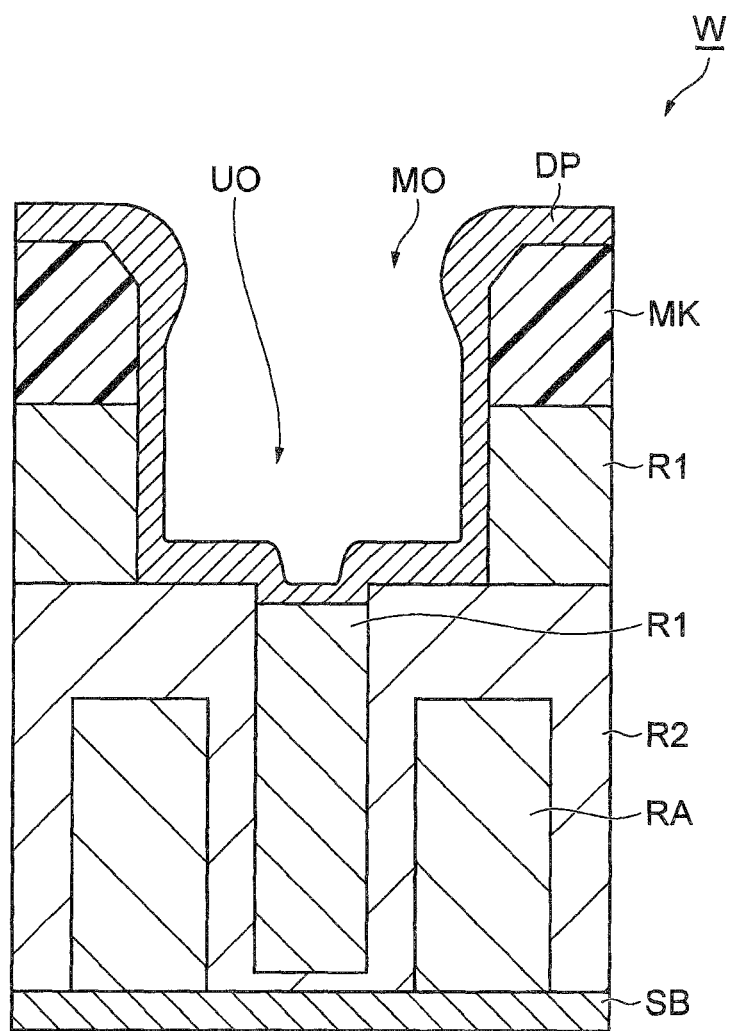
Figure 13:
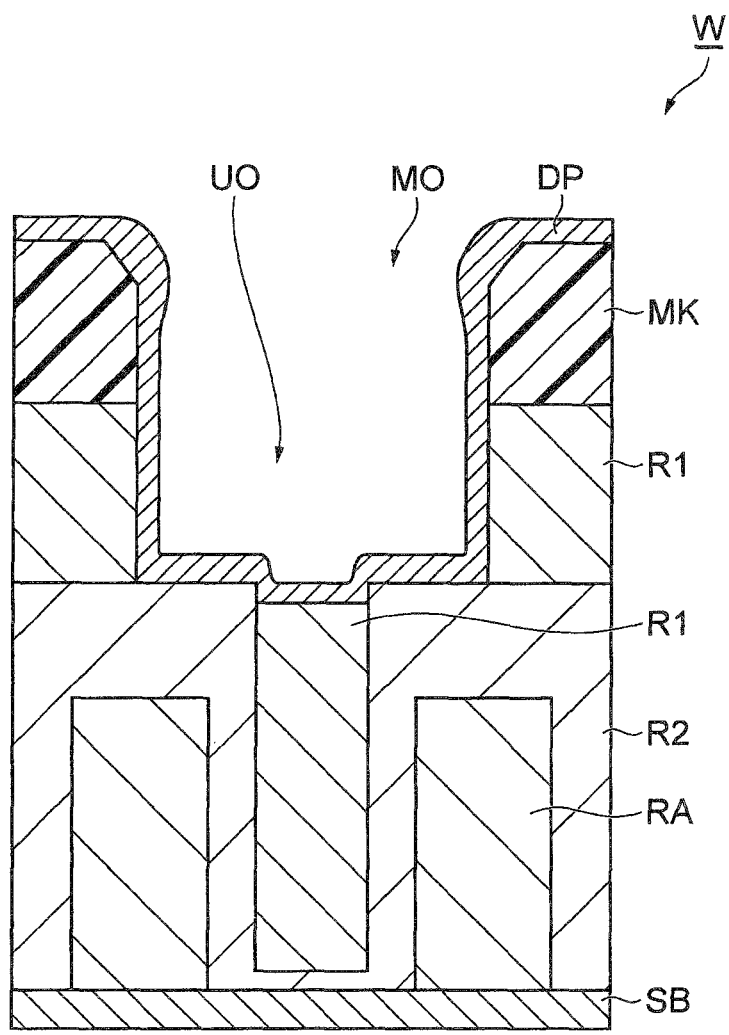
Figure 14:
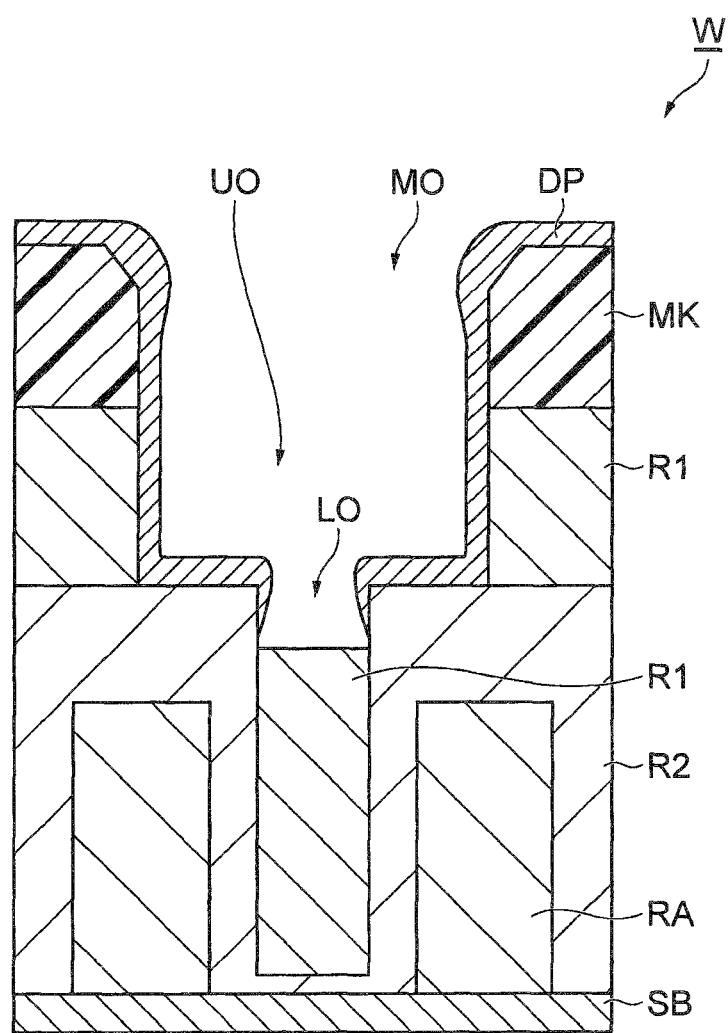

In the step ST13, active species of oxygen are generated and the amount of deposit DP on the wafer W is appropriately decreased by the active species of oxygen, as can be seen from FIG. 10. As a result, the opening MO and the upper opening UO are prevented from being blocked by an excessive amount of deposit DP. In the case of the processing gas used in the step ST13, the oxygen gas is diluted with the inert gas and, thus, excessive removal of the deposit DP can be suppressed. The operation of each component of the plasma processing apparatus 10 in the step ST13 can be controlled by the control unit Cnt.

The step ST13 is executed under the following condition.
Pressure in processing chamber: 10 mTorr (1.33 Pa) to 50 mTorr (6.65 Pa)
Processing gas
$O_2$ gas: 2 sccm to 20 sccm
Ar gas: 500 sccm to 1500 sccm
High frequency power for plasma generation: 100 W to 500 W
High frequency bias power: 0 W In the present embodiment, the step ST13 in each sequence, i.e., a single step ST13, is executed for two or more seconds. In the step ST13, the deposit DP can be etched at a rate of about 1 nm/sec or less. In the case of executing the sequence by using the plasma processing apparatus 10, it is required to switch gases when the steps ST12 to ST14 are shifted from one to another. Therefore, the step ST13 needs to be executed for two or more seconds in consideration of time required for stabilization of discharge. However, if the etching rate of the deposit DP in the step ST13 is too high, the deposit for protecting the second region R2 may be excessively removed. Thus, the deposit DP is etched at a rate of about 1 nm/sec or less to suppress the excessive removal of the deposit DP in the step ST13. As a consequence, it is possible to appropriately control the amount of the deposit DP on the wafer W. The etching rate of the deposit DP which is about 1 nm/sec or less in the step ST13 can be realized by selecting a pressure in the processing chamber, a degree of dilution of oxygen in the processing gas with a rare gas, i.e., an oxygen concentration, and a high frequency power for plasma generation from the above-described condition.

Next, in the step ST14, the first region R1 is etched. To do so, in the step ST14, the processing gas is supplied into the processing chamber 12 from a gas source selected among the gas sources of the gas source group 40. This processing gas used in the step 14 includes an inert gas. In this example, the inert gas may be a rare gas such as Ar gas. Or, the inert gas may be nitrogen gas. In the step ST14, a pressure in the processing chamber 12 is set to a predetermined level by the operation of the gas exhaust unit 50. In the step ST14, the high frequency power from the first high frequency power supply 62 is supplied to the lower electrode LE. In the step ST14, the high frequency bias power from the second high frequency power supply 64 is supplied to the lower electrode LE.

The step ST14 is executed under the following condition.
Pressure in processing chamber: 10 mTorr (1.33 Pa) to 50 mTorr (6.65 Pa)
Processing gas
Ar gas: 500 sccm to 1500 sccm
High frequency power for plasma generation: 100 W to 500 W
High frequency bias power: 20 W to 300 W In the step ST14, a plasma of an inert gas is generated and ions are attracted to the wafer W. The first region R1 is etched by radicals of fluorocarbon contained in the deposit DP. Accordingly, the first region R1 in the recess formed by the second region R2 is etched and the lower opening LO is gradually formed, as can be seen from FIG. 11. The operation of each component of the plasma processing apparatus 10 in the step ST14 can be controlled by the control unit Cnt.

In the present embodiment, the sequence SQ including the above-described steps ST11 to ST14 is repeated. As the sequence SQ is repeated, the deposit DP is formed on the wafer W by the execution of the steps ST11 and ST12 as can be seen from FIG. 12. Then, the amount of the deposit DP is decreased by the execution of the step ST13 as can be seen from FIG. 13. Next, the first region R1 is further etched by the execution of the step ST14 and, thus, the depth of the lower opening LO is increased, as can be seen from FIG. 14. As the sequence SQ is further repeated, the deposit DP is formed on the wafer W by the execution of the steps ST11 and ST12, as can be seen from FIG. 15. Thereafter, the amount of the deposit DP is decreased by the execution of the step ST13 as can be seen from FIG. 16. Next, the first region R1 is further etched by the execution of the step ST14 and, thus, the depth of the lower opening LO is further increased, as can be seen from FIG. 17. Ultimately, the first region R1 is etched until the second region R2 is exposed at the bottom of the recess.

Referring back to FIG. 1, it is determined in the step STa of the method MT whether or not a stop condition is satisfied. When the sequence SQ has been performed a predetermined number of times, it is determined that the stop condition is satisfied. When it is determined in the step STa that the stop condition is not satisfied, the sequence SQ is performed again from the step ST11. On the other hand, when it is determined in the step STa that the stop condition is satisfied, the execution of the method MT is terminated.

In the present embodiment, the conditions of the repeated sequences SQ may be set such that an etching amount of the first region R1 in the sequence SQ performed during a period including a time when the second region R2 is exposed (hereinafter, referred to as "first sequence") becomes smaller than that of the first region R1 in a next sequence SQ (hereinafter, referred to as "second sequence"). In this example, the execution time of the first sequence is set to be shorter than that of the second sequence. In this example, a ratio of the execution time of the steps ST11, ST12, ST13 and ST14 in the first sequence may be set to be equal to that of the steps ST11, ST12, ST13 and ST14 in the second sequence. For example, in the first sequence, the execution time of the step ST11 is selected from a range of 2 sec to 5 sec; the execution time of the step ST12 is selected from a range of 2 sec to 5 sec; the execution time of the step ST13 is selected from a range of 2 sec to 5 sec; and the execution time of the step ST14 is selected from a range of 5 sec to 10 sec. In the second sequence, the execution time of the step ST11 is selected from a range of 2 sec to 10 sec; the execution time of the step ST12 is selected from a range of 2 sec to 10 sec; the execution time of the step ST13 is selected from a range of 2 sec to 10 sec; and the execution time of the step ST14 is selected from a range of 5 sec to 10 sec.

Although the active species of fluorocarbon generated in the steps ST11 and ST12 are deposited on the second region R2 and protect the second region R2, the second region R2 may be etched when the second region R2 is exposed by the etching process of the first region R1. Therefore, in the present embodiment, the first sequence is performed during a period in which the second region R2 is exposed. Accordingly, the deposit DP is formed on the wafer W while decreasing the etching amount and the second region R2 is protected by the deposit DP. Then, the second sequence in which the etching amount is large is performed. As a result, in the present embodiment, the first region R1 can be etched while suppressing the etching of the second region R2.

In the step ST14 of the sequence SQ (hereinafter, referred to as "third sequence") executed after the second sequence, the high frequency bias power may be set to be greater than the high frequency bias power used in the step ST14 of the first sequence and the second sequence. For example, in the step ST14 of the first sequence and the second sequence, the high frequency bias power is set within a range from 20 W to 100 W. In the step ST14 of the third sequence, the high frequency bias power is set within a range from 100 W to 300 W. In the third sequence of this example, the execution time of the step ST11 is selected from a range of 2 sec to 10 sec; the execution time of the step ST12 is selected from a range of 2 sec to 10 sec; the execution time of the step ST13 is selected from a range of 2 sec to 10 sec; and the execution time of the step ST14 is selected from a range of 5 sec to 10 sec.

Figure 15:
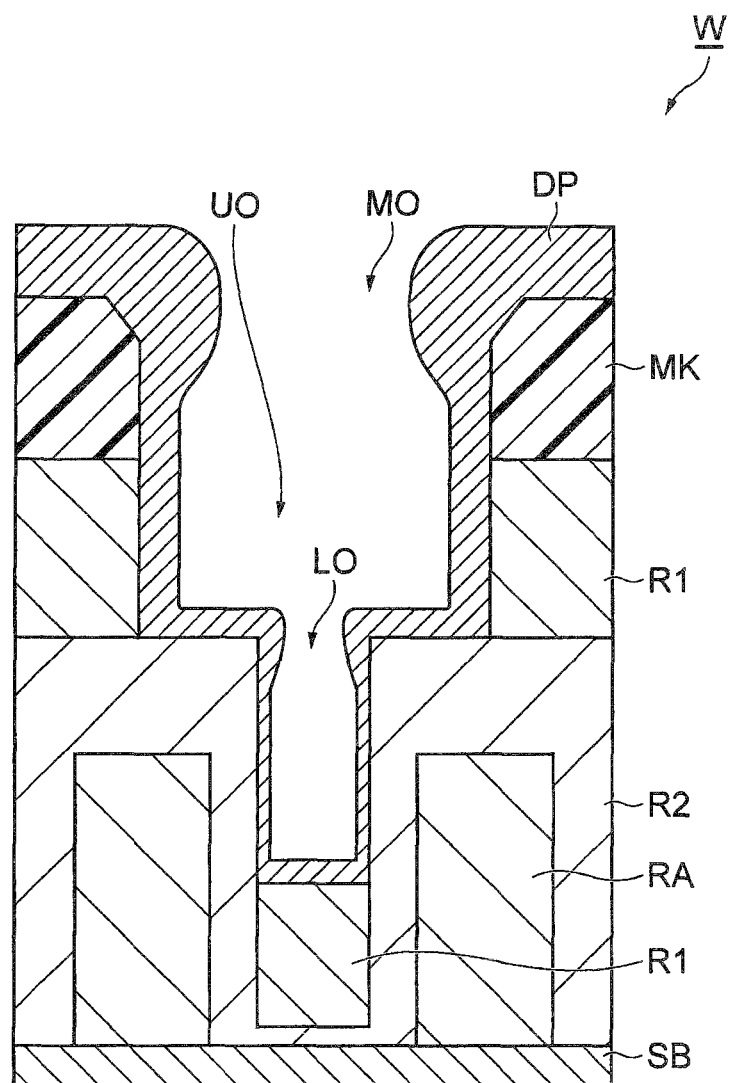
Figure 16:
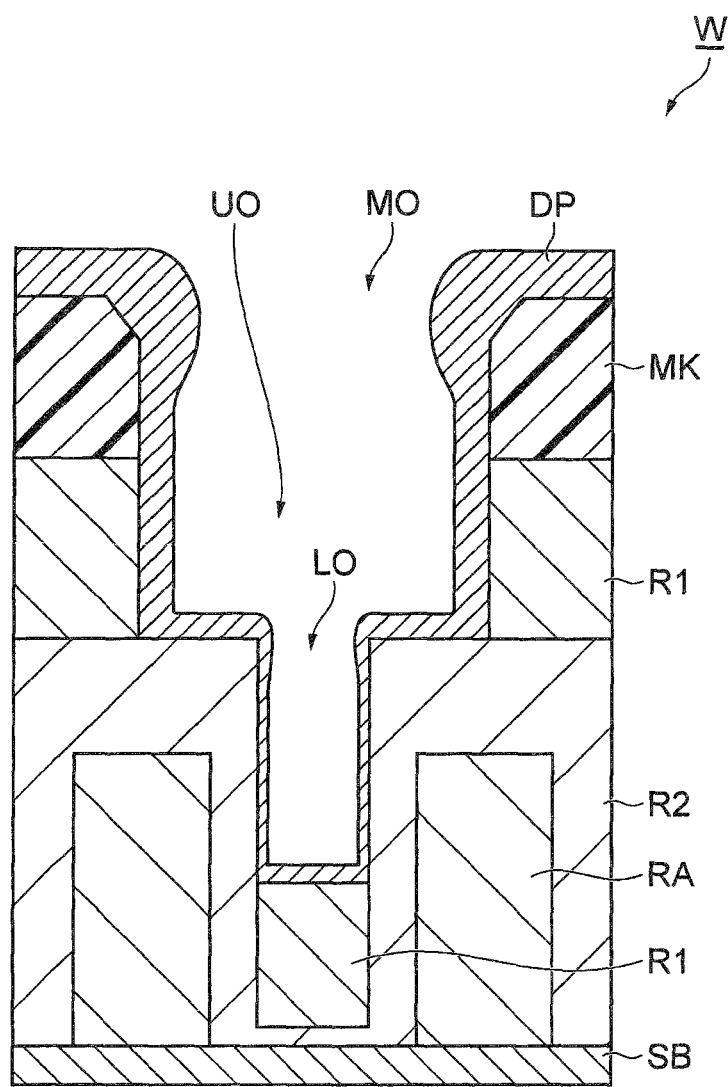
Figure 17:
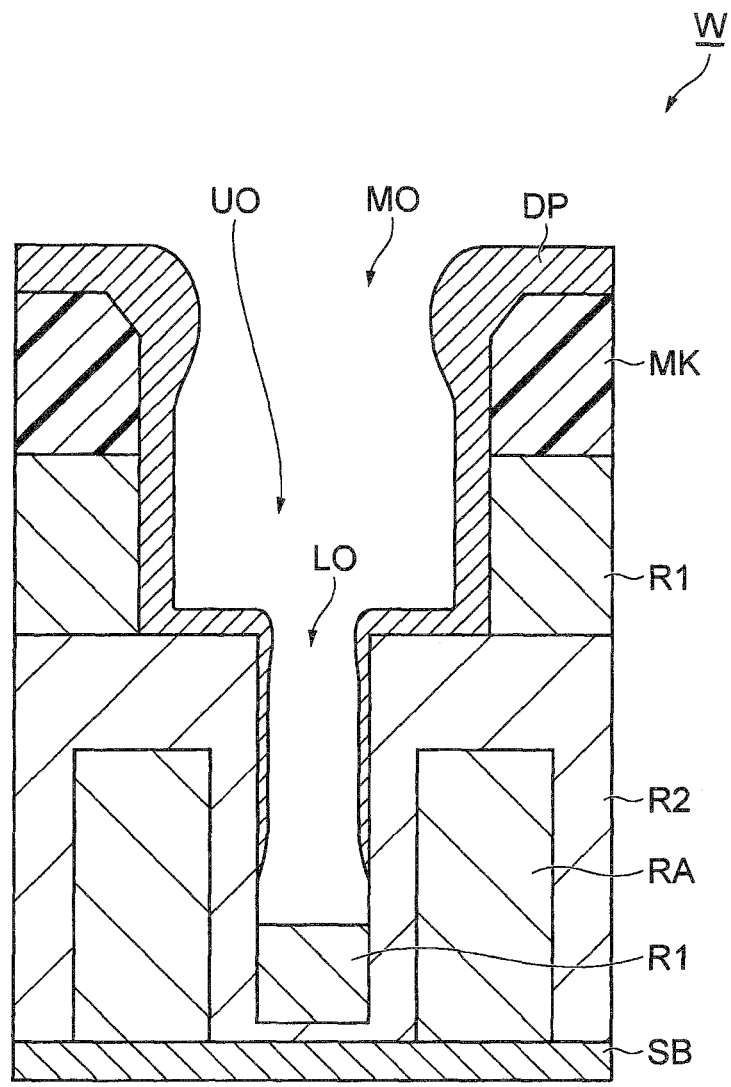

As can be seen from FIG. 15, the amount of the deposit DP on the wafer W is considerably increased after the first sequence and the second sequence. When the amount of the deposit DP is increased, the width of the opening MO, the width of the upper opening UO, and the width of the lower opening LO are decreased by the deposit DP. Accordingly, the flow velocity of ions may not be enough to reach the deep portion of the lower opening LO. Since, however, a relatively large high frequency bias power is used in the step ST14 of the third sequence, the energy of ions attracted to the wafer W can be increased. As a result, even if the lower opening LO has a large depth, ions can reach the deep portion of the lower opening LO.

While various embodiments have been described, the disclosure may be variously modified without being limited to the above-described embodiments. For example, in the method MT, the high frequency power for plasma generation is supplied to the upper electrode 30. However, the high frequency power may be supplied to the lower electrode LE. Further, in the method MT, a plasma processing apparatus other than the plasma processing apparatus 10 may be employed. Specifically, the method MT can be performed by any plasma processing apparatus such as an inductively coupled plasma processing apparatus or a plasma processing apparatus for generating a plasma by using a surface wave such as a microwave.

The execution order of the steps ST11 to ST14 in the sequence SQ may be changed. For example, in the sequence SQ, the step ST13 may be executed after the step ST14.

A modified method may include only the sequence SQ. In that case, the wafer W is not limited to that shown in FIG. 2 and may be modified as long as it includes a first region of silicon oxide and a second region of silicon nitride.

It is not necessary that all of the repeatedly performed sequences SQ include the step ST11. For example, the sequence SQ including the step ST11 may be performed during a period including a time when the second region R2 is exposed. The sequence SQ performed in other periods may not include the step ST11.

While the disclosure has been shown and described with respect to the embodiments, it will be understood by those skilled in the art that various changes and modifications may be made without departing from the scope of the disclosure as defined in the following claims.

What is claimed is:

1. An etching method for selectively etching a first region of silicon oxide with respect to a second region of silicon nitride by performing plasma processing on a target object including the first region and the second region, the etching method comprising the sequential steps of:
   (a) generating a plasma of a processing gas including a fluorocarbon gas in a processing chamber where the target object is accommodated;
   (b) generating the plasma of the processing gas including the fluorocarbon gas in the processing chamber where the target object is accommodated; and
   (c) generating, after terminating the steps (a) and (b), a plasma of an inert gas and etching the first region by radicals of fluorocarbon contained in a deposit which is formed on the target object by the steps (a) and (b),
   wherein a high frequency power used for plasma generation in the step (a) is smaller than a high frequency power used for plasma generation in the step (b).

2. The etching method of claim 1, wherein a sequence including the steps (a) to (c) which are executed in that order is repeatedly performed.

3. The etching method of claim 2, wherein the second region is formed to have a recess,
   wherein the first region fills the recess and covers the second region,
   wherein the target object includes a mask that is provided on the first region and has an opening provided over the recess, the opening having a width greater than a width of the recess,
   wherein the etching method further comprises the step of:
   (d) etching the first region until immediately before the second region is exposed, and
   wherein the sequence is performed after the step (d).

4. The etching method of claim 3, wherein the sequence further includes the step of (e) generating a plasma of a processing gas including an oxygen-containing gas and an inert gas in the processing chamber where the target object is accommodated.

5. The etching method of claim 3, wherein repeatedly performed sequences include a first sequence and a second sequence, wherein the first sequence is performed in a period including a time when the second region is exposed and the second sequence is performed after the first sequence, and wherein an etching amount of the first region in the second sequence becomes larger than that in the first sequence.

6. The etching method of claim 5, wherein the repeatedly performed sequences further include a third sequence which is performed after the second sequence, and
   wherein a high frequency bias power for attracting ions to the target object in the step (c) of the third sequence is set to be greater than that in the step (c) of the first sequence and the second sequence.

7. The etching method of claim 3, wherein the step (d) is performed by a plasma of a processing gas including a fluorocarbon gas, and
   wherein a ratio of fluorine atoms to carbon atoms in the fluorocarbon gas used in the step (d) is higher than that in the fluorocarbon gas used in the steps (a) and (b).

8. The etching method of claim 7, wherein an amount of the deposit formed on the target object is increased by the step (b).

9. The etching method of claim 8, wherein the step (c) is performed with a high frequency bias power for attracting ions to the target object whereas in the steps (a) and (b), no high frequency bias power for attracting ions to the target object is applied.

10. The etching method of claim 7, wherein the step (c) is performed with a high frequency bias power for attracting ions to the target object whereas in the steps (a) and (b), no high frequency bias power for attracting ions to the target object is applied.

11. The etching method of claim 1, wherein the steps (a) and (b) are executed in a period including a time when the second region is exposed.

12. The etching method of claim 1, wherein an amount of the deposit formed on the target object is increased by the step (b).

13. The etching method of claim 12, wherein the step (c) is performed with a high frequency bias power for attracting ions to the target object whereas in the steps (a) and (b), no high frequency bias power for attracting ions to the target object is applied.

14. The etching method of claim 1, wherein the step (c) is performed with a high frequency bias power for attracting ions to the target object whereas in the steps (a) and (b), no high frequency bias power for attracting ions to the target object is applied.

* * * * *